United States Patent
Yang

(10) Patent No.: US 7,931,973 B2
(45) Date of Patent: Apr. 26, 2011

(54) MANUFACTURING METHOD OF METAL STRUCTURE IN MULTI-LAYER SUBSTRATE AND STRUCTURE THEREOF

(75) Inventor: Chih-kuang Yang, Hsin-Chu (TW)

(73) Assignee: Princo Corp., Hsinchu (TW)

( * ) Notice: Subject to any disclaimer, the term of this patent is extended or adjusted under 35 U.S.C. 154(b) by 0 days.

(21) Appl. No.: 12/553,604

(22) Filed: Sep. 3, 2009

(65) Prior Publication Data
US 2009/0321115 A1    Dec. 31, 2009

Related U.S. Application Data

(62) Division of application No. 11/951,057, filed on Dec. 5, 2007.

(51) Int. Cl.
*B32B 15/08*    (2006.01)
*H01B 5/14*    (2006.01)

(52) U.S. Cl. ............ 428/458; 428/209; 174/126.1; 174/126.4; 174/257; 174/258; 257/784

(58) Field of Classification Search ............ 428/378, 428/209, 901, 458; 174/126.1, 126.4, 257, 174/258; 157/784
See application file for complete search history.

(56) References Cited

U.S. PATENT DOCUMENTS

| | | | | |
|---|---|---|---|---|
| 3,057,952 A | * | 10/1962 | Gordon | 174/117 R |
| 3,168,617 A | * | 2/1965 | Richter | 174/117 FF |
| 3,215,574 A | * | 11/1965 | Korb | 216/20 |
| 4,085,502 A | * | 4/1978 | Ostman et al. | 29/843 |
| 5,158,657 A | | 10/1992 | Kadokura | |
| 5,213,840 A | | 5/1993 | Retallick et al. | |
| 5,246,564 A | | 9/1993 | Tamiya et al. | |
| 5,281,765 A | * | 1/1994 | Iura et al. | 174/117 F |
| 5,458,763 A | * | 10/1995 | Kobayashi et al. | 205/104 |
| 5,483,021 A | * | 1/1996 | Saen et al. | 174/117 FF |
| 5,485,352 A | | 1/1996 | Shibuya et al. | |
| 5,527,997 A | * | 6/1996 | Saen et al. | 174/126.2 |
| 5,666,717 A | * | 9/1997 | Matsumoto et al. | 29/603.12 |
| 6,100,582 A | * | 8/2000 | Omote et al. | 257/699 |
| 6,198,284 B1 | * | 3/2001 | Doty | 324/318 |
| 6,426,143 B1 | * | 7/2002 | Voss et al. | 428/378 |
| 6,518,503 B1 | * | 2/2003 | Yamanobe et al. | 174/117 FF |
| 7,087,438 B2 | | 8/2006 | Kasko et al. | |

FOREIGN PATENT DOCUMENTS

| | | |
|---|---|---|
| CN | 1461181 | 12/2003 |
| CN | 1494120 | 5/2004 |
| CN | 1505123 | 6/2004 |
| CN | 2741319 | 11/2005 |
| CN | 1744799 A | 3/2006 |
| CN | 1940599 | 4/2007 |

(Continued)

*Primary Examiner* — Cathy Lam

(57) ABSTRACT

Disclosed is a manufacturing method of metal structure in multi-layer substrate and structure thereof. The manufacturing method of the present invention comprises following steps: coating at least one photoresist layer on a surface of a dielectric layer, and then exposing the photoresist dielectric layer to define a predetermined position of the metal structure; therefore, removing the photoresist layer at the predetermined position and forming the metal structure at the predetermined position before forming at least one top-cover metal layer on a surface of the metal structure. The present invention can form a cover metal layer covering over the top surface and the two side surfaces, even the under surface of the metal structure, by one single photomask. Moreover, a finer metal structure with higher reliability can be manufactured. Furthermore, a metal structure can be used as a coaxial structure is also realized.

4 Claims, 10 Drawing Sheets

FOREIGN PATENT DOCUMENTS

| | | |
|---|---|---|
| CN | 1957298 | 5/2007 |
| EP | 0215557 | 3/1987 |
| JP | 1-205495 | 8/1989 |
| JP | 2000-340901 | 12/2000 |
| WO | 2006/134399 | 12/2006 |
| WO | 2007/037553 | 4/2007 |

* cited by examiner

MANUFACTURING METHOD OF METAL STRUCTURE IN MULTI-LAYER SUBSTRATE AND STRUCTURE THEREOF

CROSS REFERENCE TO RELATED APPLICATION

This is a division of a U.S. patent application Ser. No. 11/951,057, filed on Dec. 5, 2007.

BACKGROUND OF THE INVENTION

1. Field of the Invention

The present invention generally relates to a method for manufacturing a metal structure in a multi-layer substrate and the structure thereof, and more particularly to a method for manufacturing metal structures in a flexible multi-layer substrate and the structure thereof.

2. Description of Prior Art

Miniaturization for all electronic productions is an unavoidable trend in this modern world. While the scales of the semiconductor chips continuously get smaller, the scale of the related technology for packaging needs to be micro-miniaturized to follow the scale of the semiconductor chip is also unavoidable. Today, because the integration of integrated circuits has been greatly increased, using a multi-layer substrate to package different kinds of chip devices is necessary to obtain a high performance integration system consequently. In the package technology industry, an etching method or build up process is a currently a commonly used method to manufacture a metal structure in a multi-layer substrate. Meanwhile, the higher the integration of semiconductor chip becomes, the higher the demand for finer metal structure.

Please refer to FIG. 1, which depicts a diagram of manufacturing a metal structure by an etching method according to the prior art. A metal layer is formed on a dielectric layer 100 of a multi-layer substrate. After a photoresist layer 104 is coated and exposed, the metal structures 102 are formed by an etching method. Generally, the metal structures 102 are formed by wet etching according to prior art. The side surfaces of the metal structures 102 are etched and undercuts happens thereto as shown in FIG. 1 because the isotropic character of the wet etching skill. Besides, the side surfaces become rough because of grain size of metal, especially of copper. With the increasing demand for finer metal structure brought by higher integration of semiconductor chips, an etching method now no longer can satisfy the needs for finer metal structure because of its drawbacks of the undercut and the roughness of the side surface.

Generally, copper can be used as the material of the metal structure when a multi-layer substrate is manufactured. It is easy to be corroded, especially when the polyimide is used to manufacture the dielectric layer. If a protective cover metal layer is desired to cover the metal structure's surface to prevent corrosion from other materials of the multi-layer substrate and to raise reliability of the metal structure, additional exposing and etching processes for forming the cover metal layers to cover the metal structure will be necessary according to the traditional etching method. The yield in manufacturing the multi-layer substrate is potentially decreased, due to issue of the positioning accuracy of the metal structure and the cover metal layer. Meanwhile, cost is also increased. Furthermore, the cover metal layer of covering the top surface, two side surfaces, even the under surface of the metal structure cannot be formed by one single photomask according to the etching method, i.e. the etching method cannot form the cover metal layer covering the metal structure completely to raise the reliability of the metal structure. The etching method cannot realize a metal structure as being a coaxial structure, either.

Please refer to FIG. 2A to FIG. 2D, which depict diagrams of manufacturing a metal structure by build up process according to the prior art. FIG. 2A shows a step of forming a very thin metal layer (seed layer) 102 on a dielectric layer 100 of the multi-layer substrate. FIG. 2B shows a step of forming a metal layer at the predetermined position (such as Electroplating) after coating a photoresist layer 104 except the predetermined position. HG 2C shows a step of removing the photoresist layer 104, and then the dielectric layer 100 and the metal layer 102 are left. FIG. 2D shows a step of etching the metal layer 102 to remove the metal material outside the predetermined position. However, the side surfaces of the metal structures 102 are etched as shown in FIG. 2 because the isotropic character of the wet etching process. Besides, because of the limitation of the size of the metal grain, the side surfaces of the metal structures become rough after the etching process.

Because of the limitation came of the size of the metal grain, either the etching method or the build up process cannot prevent the metal structure side surfaces from becoming rough. Such drawback can be a fatal restriction to the demand for finer metal structure. Furthermore, either the etching method or the build up process cannot form the cover metal layer of covering the top surface, two side surfaces, even the under surface of the metal structure completely by one single photomask to raise the reliability of the metal structure.

Therefore, there is a need to develop a method for manufacturing a metal structure in a multi-layer substrate and the structure thereof, so as to form the cover metal layer of covering the top surface, two side surfaces, even the under surface of the metal structure completely by one single photomask. The metal structure can be finer and with higher reliability and can be a coaxial structure.

SUMMARY OF THE INVENTION

An objective of the present invention is to provide a method for manufacturing a metal structure in a multi-layer substrate and the structure thereof to form a cover metal layer covering the top surface and the two side surfaces, even the under surface of the metal structure by one single photomask.

Another objective of the present invention is to provide a method for manufacturing metal structures in a multi-layer substrate and the structure thereof, so as to prevent the metal structure from corrosion or contamination caused by other materials of the multi-layer substrate and to manufacture a finer metal structure with higher reliability.

Briefly summarized, the manufacturing method of the present invention comprises the follow steps:

coating at least one photoresist layer on a surface of a dielectric layer;

exposing the photoresist layer to define a predetermined position of the metal structure;

removing the photoresist layer at the predetermined position (such as developing process);

forming the metal structure at the predetermined position; and forming at least one top-cover metal layer on a surface of the metal structure.

Before the step of forming the metal structure, the manufacturing method of the present invention may comprise a step of forming an under-cover metal layer at the predetermined position to cover the under surface of the metal structure. After the step of forming an under-cover metal layer, the manufacturing method of the present invention may comprise a step of forming an under-cover dielectric layer on the under-cover metal layer. Moreover, the manufacturing method of the present invention comprises a step of forming a top-cover dielectric layer on the surface of the metal layer before the step of forming the top-cover metal layer. Accordingly, the metal structure, the top-cover, under-cover dielectric layers, the top-cover metal layer and the under-cover metal layer can be employed as a coaxial structure.

The metal structure in the multi-layer substrate of the present invention comprises a metal structure and a top-cover metal layer. The metal structure is at a predetermined position on a dielectric layer. The top-cover metal layer is formed on a top surface and two side surfaces of the metal structure. Moreover, an under-cover metal layer is at an under surface of the metal structure, and then the metal layers can protect the metal structure. Furthermore, a top-cover dielectric layer and an under-cover dielectric layer are formed between the metal structure and the top-cover, under-cover metal layers. Accordingly, a coaxial structure can be realized.

According to the manufacturing method of the present invention, forming a cover metal layer covering the top surface and the two side surfaces, even the under surface of the metal structure by one single photomask becomes possible. Unlike etching or build up process according to prior arts, the manufacturing method of the present invention prevents the side surfaces of the metal structure from etching which satisfies the demand for the finer metal structure nowadays. Moreover, the top-cover metal layer and the under-cover metal layer are formed to prevent the metal structure from corrosion or contamination, so as to raise the reliability of the metal structure. Meanwhile, being a coaxial structure can also be realized. Therefore, the present invention can greatly increase the integration of the metal structures in the multi-layer substrate. The manufacturing method of the present invention can also be applied for a deformable or flexible substrate.

DETAILED DESCRIPTION OF THE INVENTION

Figure 1:
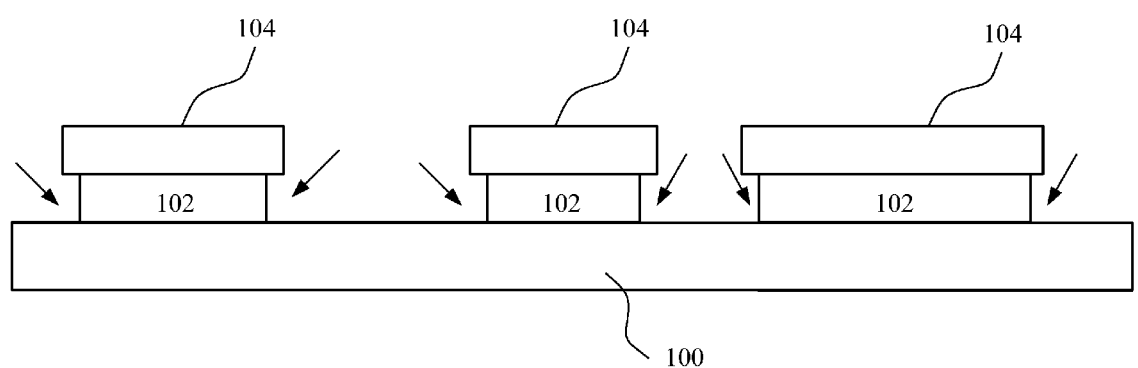
FIG. 1 depicts a diagram of manufacturing a metal structure by etching according to the prior art.
Figure 2A:
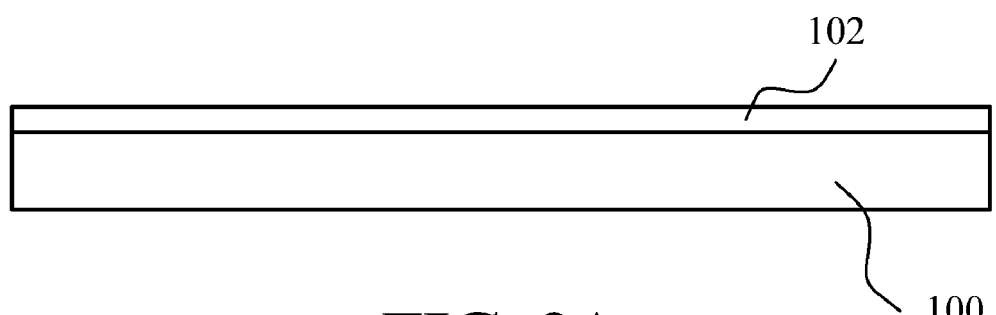
FIG. 2A to FIG. 2D depict diagrams of manufacturing a metal structure by build up process according to the prior art.
Figure 2B:
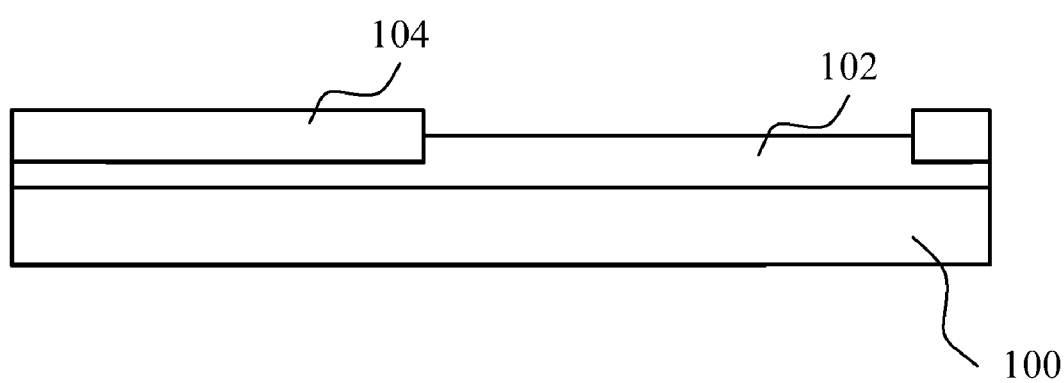
Figure 2C:
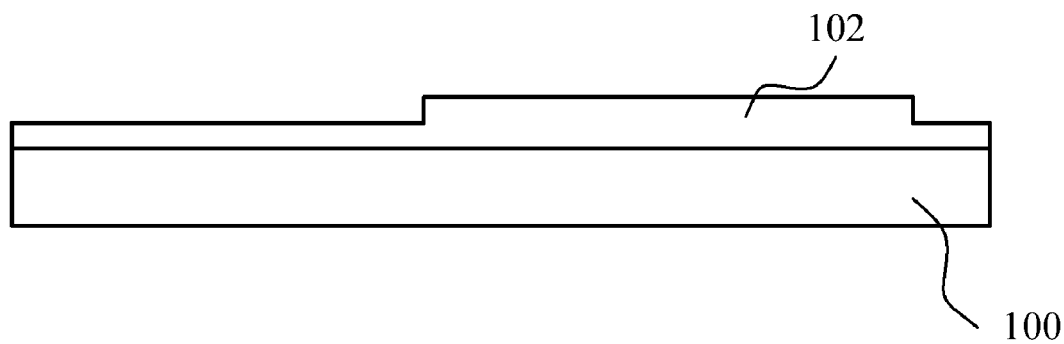
Figure 2D:
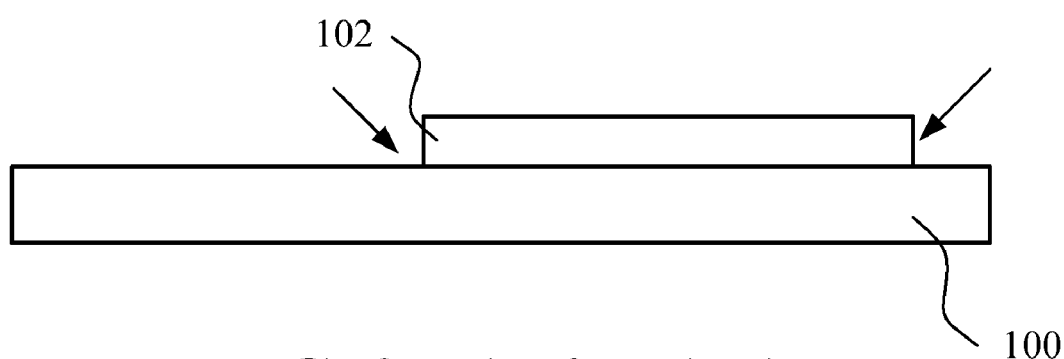
Figure 3A:
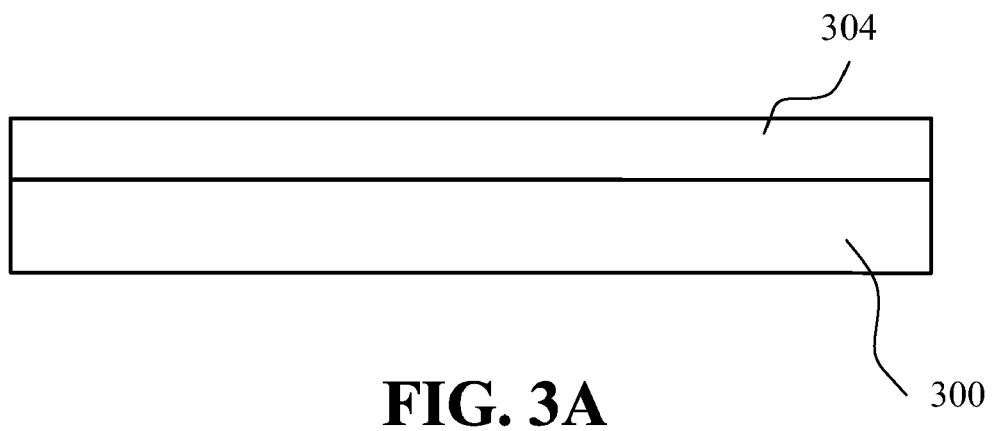
FIG. 3A to FIG. 3E depict a structural flow chart of a manufacturing method of a metal structure in a multi-layer substrate according to the first embodiment of the present invention.
Figure 3B:
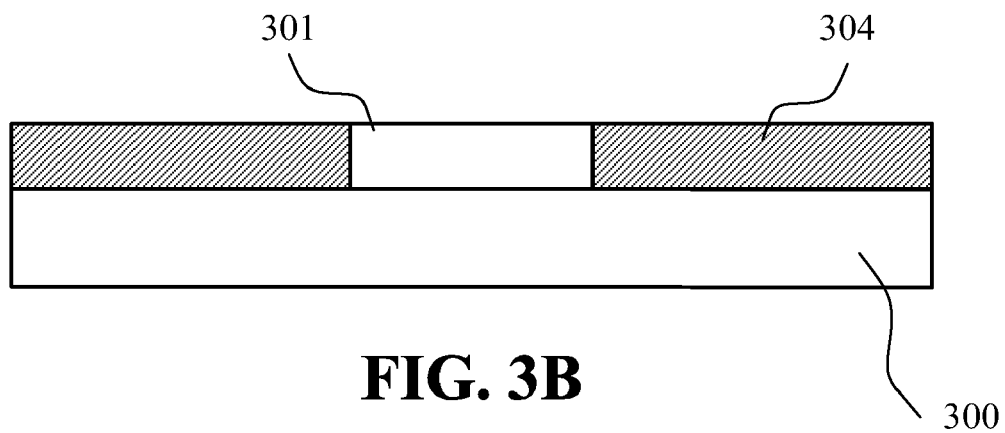
Figure 3C:
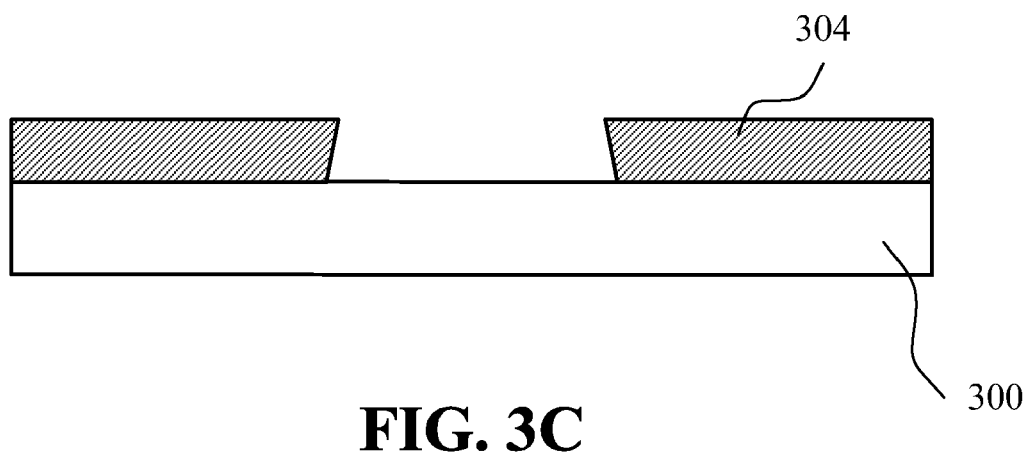
Figure 3D:
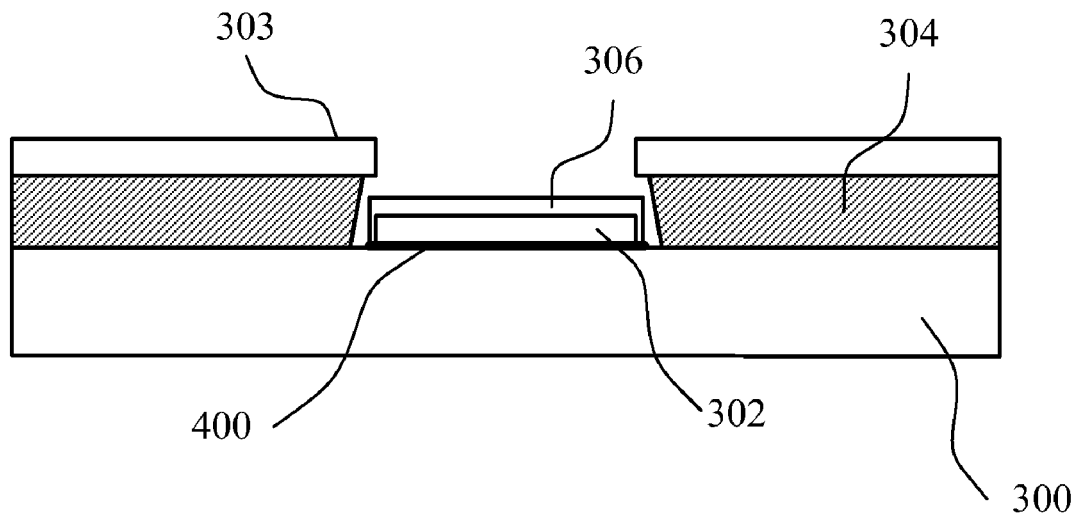
Figure 3E:
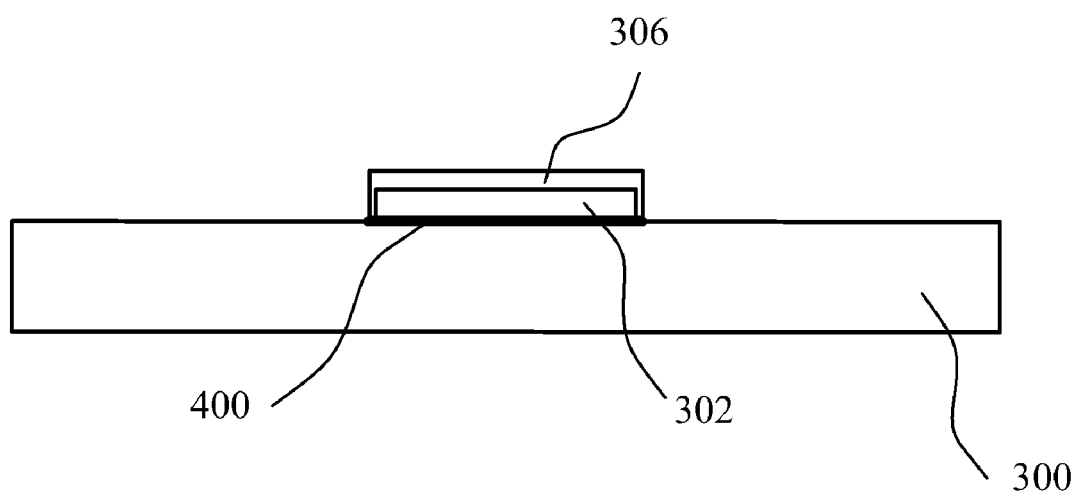

Please refer to FIG. 3A to FIG. 3E, which depict a structural flow chart of a manufacturing method of a metal structure in a multi-layer substrate according to the first embodiment of the present invention. FIG. 3A shows a step of coating a photoresist layer 304 on a surface of a dielectric layer 300. FIG. 3B shows a step of exposing the photoresist layer 304 except the photoresist layer 301 at a predetermined position of the metal structure after coating a photoresist layer 304. FIG. 3C shows a step of removing the photoresist layer 301 at the predetermined position (such as developing process). In this embodiment, the negative type photoresist layer is employed. When the photoresist layer 301 is removed by the developer, the edge of the photoresist layer 304 adjacent to the predetermined position is shaped like top-protruding formation because the top of the photoresist layer 304 receives more light than the bottom. However, the present invention is not limited with the negative type photoresist layer. Employing two photoresist layers can also be considered, such as, using the two positive type photoresist layers has different development rates. Then, the photoresist layers at the predetermined position are exposed. When the photoresist layers at the predetermined position are removed by the developer, the aforesaid edge can also be shaped like top-protruding formation because there is difference between the development rates of the top photoresist layer and the bottom photoresist layer. FIG. 3D shows steps of forming the metal structure 302 at the predetermined position (also forming a metal layer 303 on the photoresist layer 304) and forming a top-cover metal layer 306 on the surface of the metal structure 302 to protect the metal structure 302. FIG. 3E shows a step of removing the metal layer 303 and the photoresist layer 304 for the processes thereafter.

As shown in FIG. 3D, before the step of forming the metal structure 302, the manufacturing method of the present invention may comprise a step of implementing an interface adhesion enhancing process (such as a plasma treatment) on the surface 400 of the dielectric layer 300 at the predetermined position to increase adhesion intensity between the dielectric layer 300 and the metal structure 302.

Figure 4A:
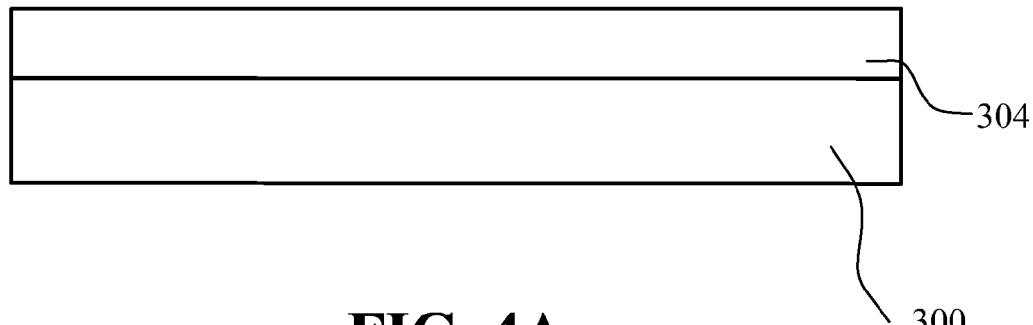
FIG. 4A to FIG. 4F depict a structural flow chart of a manufacturing method of a metal structure in a multi-layer substrate according to the second embodiment of the present invention.
Figure 4B:
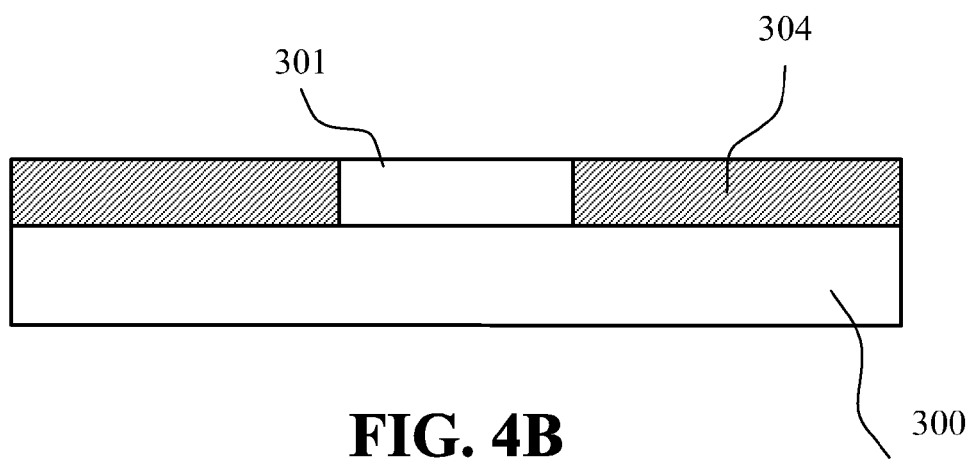
Figure 4C:
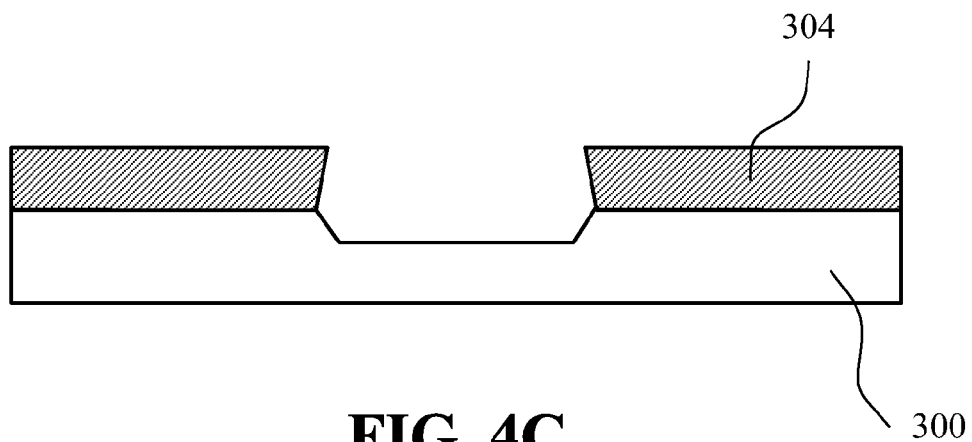
Figure 4D:
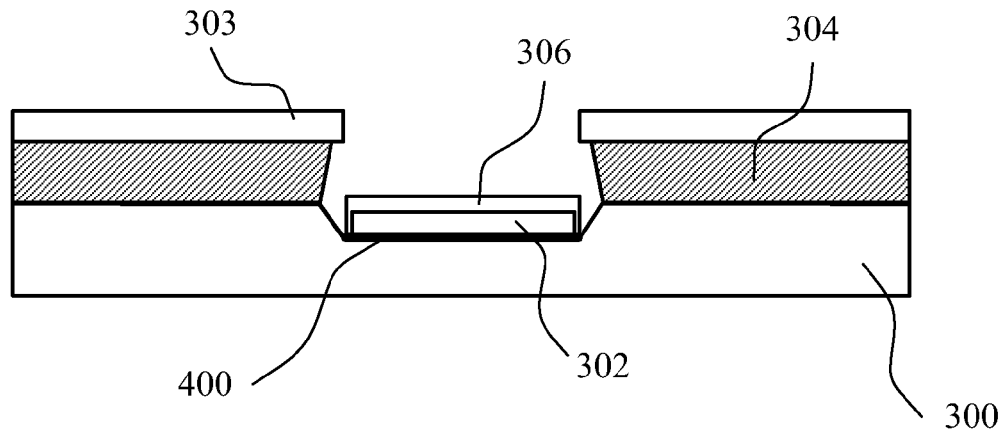
Figure 4E:
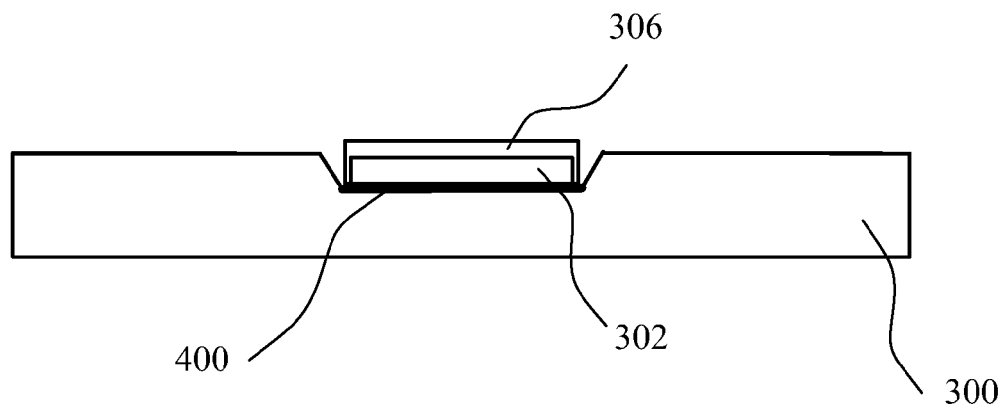
Figure 4F:
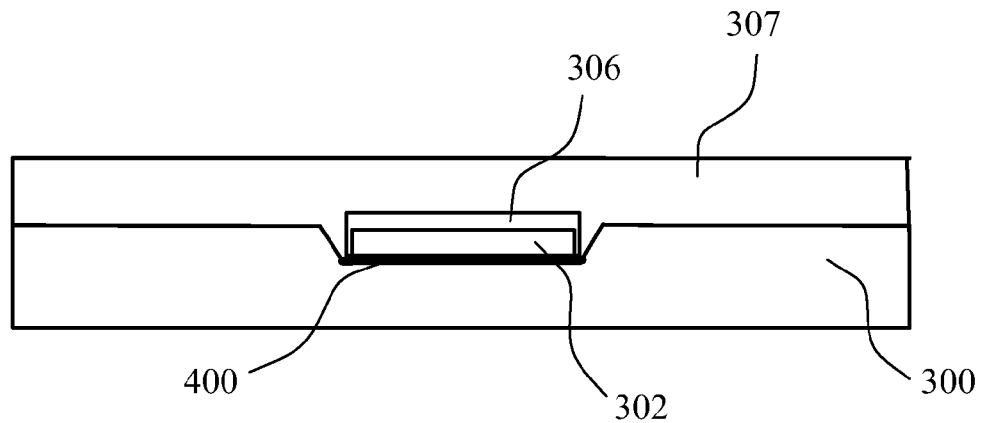

Please refer to FIG. 4A to FIG. 4F, which depict a structural flow chart of a manufacturing method of a metal structure in a multi-layer substrate according to the second embodiment of the present invention. FIG. 4A shows a step of coating a photoresist layer 304 on a surface of a dielectric layer 300. FIG. 4B shows a step of exposing the photoresist layer 304 except the photoresist layer 301 at a predetermined position of the metal structure after coating a photoresist layer 304. FIG. 4C shows steps of removing the photoresist layer 301 at the predetermined position, and then etching a certain depth of the dielectric layer 300 at the predetermined position. In this embodiment, the negative type photoresist layer is employed. When the photoresist layer 301 is removed by the developer, the edge of the photoresist layer 304 adjacent to the predetermined position is shaped like top-protruding formation because the top of the photoresist layer 304 receives more light than the bottom. However, the present invention is not limited with the negative type photoresist layer. Employing two photoresist layers can also be considered to obtain the same shape. FIG. 4D shows steps of forming the metal structure 302 at the predetermined position (also forming a metal layer 303 on the photoresist layer 304) and forming a top-cover metal layer 306 on the surface of the metal structure 302 to protect the metal structure 302. FIG. 4E shows a step of removing the metal layer 303 and the photoresist layer 304 for the processes thereafter.

In the second embodiment of the present invention, the dielectric layer 300 at the predetermined position becomes a concave structure due to etching the certain depth thereof. Such concave structure attends to strengthen adhesion of the metal structure 302 to the dielectric layer 300 while it is formed thereon. During the step of forming the metal structure 302, the thickness of the metal structure 302 can also be tuned to be as high as the dielectric layer 300 to provide a total flat surface for the processes thereafter. Alternatively, the thickness of the metal structure 302 can also be tuned when forming in the middle between the dielectric layer 300 and the dielectric layer 307. Accordingly, a better stress balance when bending the multi-layer substrate can be obtained, so as to make a multi-layer substrate more flexible and less warped.

As shown in FIG. 4D, before the step of forming the metal structure 302, the manufacturing method of the present invention may comprise a step of implementing an interface adhesion enhancing process (such as a plasma treatment) on the surface 400 of the dielectric layer 300 at the predetermined position to increase adhesion intensity between the dielectric layer 300 and the metal structure 302.

Figure 5A:
FIG. 5A to FIG. 5E depict a structural flow chart of a manufacturing method of a metal structure in a multi-layer substrate according to the third embodiment of the present invention.
Figure 5B:
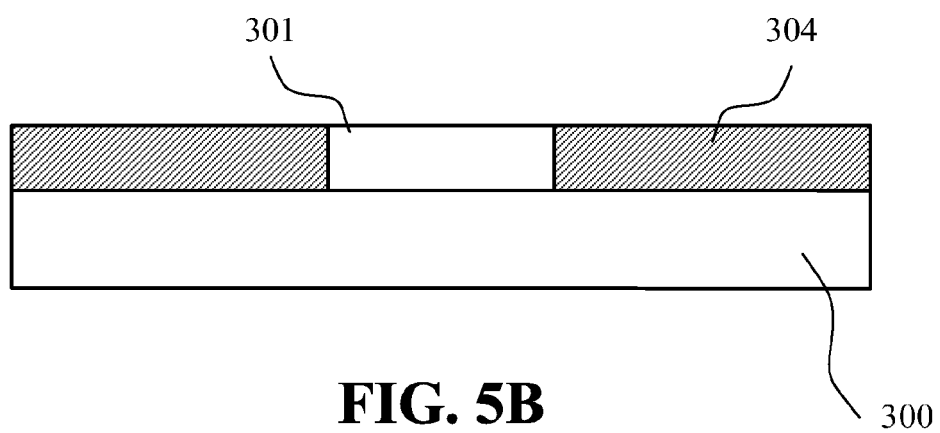
Figure 5C:
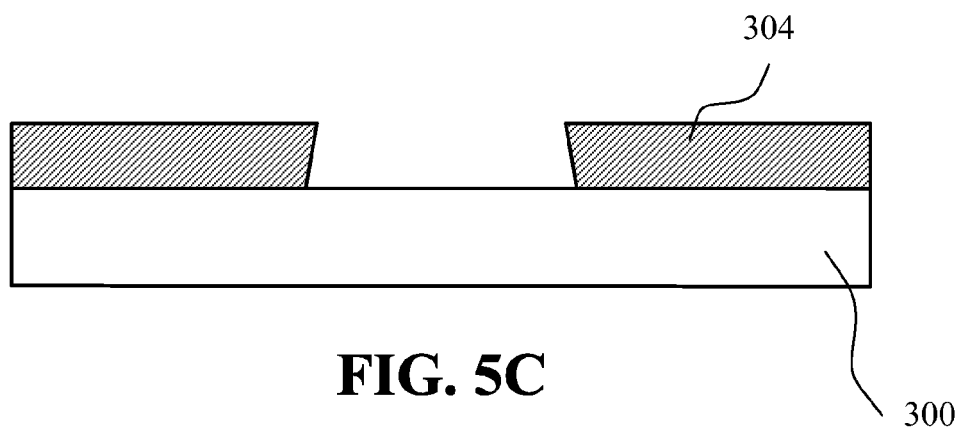
Figure 5D:
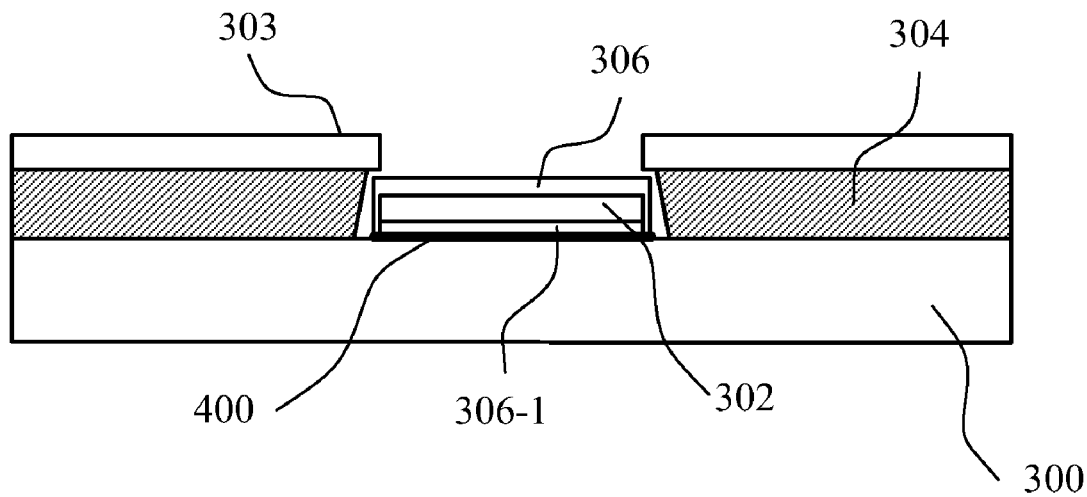
Figure 5E:
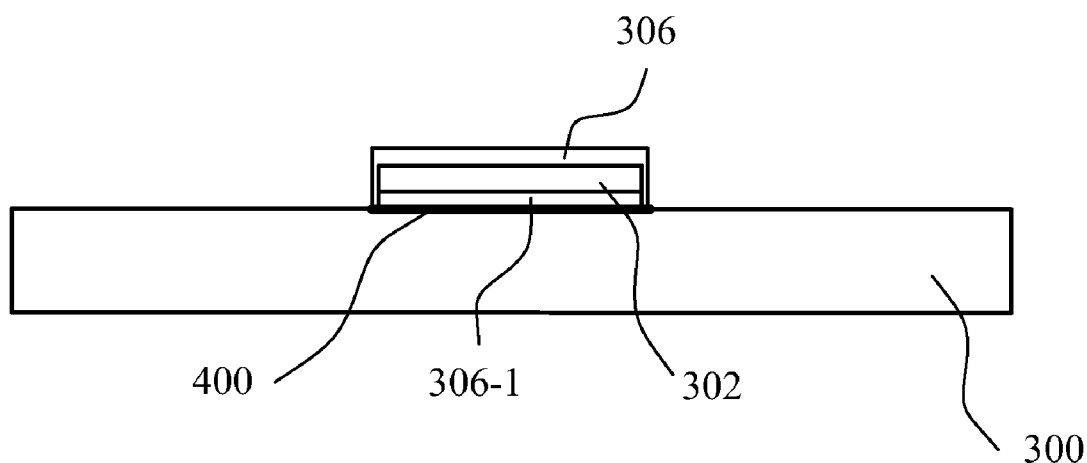

Please refer to FIG. 5A to FIG. 5E, which depict a structural flow chart of a manufacturing method of a metal structure in a multi-layer substrate according to the third embodiment of the present invention. The steps shown in FIG. 5A to FIG. 5C are the same as the steps shown in FIG. 3A to FIG. 3C. FIG. 5D shows steps of forming the under-cover metal layer 306-1, and then forming the metal structure 302 at the predetermined position (also forming a metal layer 303 on the photoresist layer 304), moreover, forming a top-cover metal layer 306 on the surface of the metal structure 302 to cover the metal structure 302 completely.

Furthermore, the manufacturing method of the present invention may comprise a step of forming an under-cover dielectric layer on the under-cover metal layer 306-1 after the step of forming under-cover metal layer 306-1 and a step of forming a top-cover dielectric layer on the metal structure 302 before the step of forming the top-cover metal layer 306 on a top surface and two side surfaces of the metal structure 302. Accordingly, the metal structure 302, the top-cover dielectric layer, the under-cover dielectric layer, the top-cover metal layer 306 and the under-cover metal layer 306-1 can be employed as a coaxial structure. The top-cover metal layer 306 and the under-cover metal layer 306-1 can be a metallic shield to transmit the high frequency signals.

Furthermore, the present invention can also replace the top-cover metal layer 306 and the under-cover metal layer 306-1 shown in FIG. 5D with a top-cover dielectric layer and an under-cover dielectric layer formed by a vacuum coating to provide a complete protection to the metal structure 302. As shown in FIG. 5D, before the step of forming the under-cover metal layer 306-1, the manufacturing method of the present invention may comprise a step of implementing an interface adhesion enhancing process (such as a plasma treatment) on the surface 400 of the dielectric layer 300 at the predetermined position to increase adhesion intensity between the dielectric layer 300 and the under-cover metal layer 306-1.

Figure 6A:
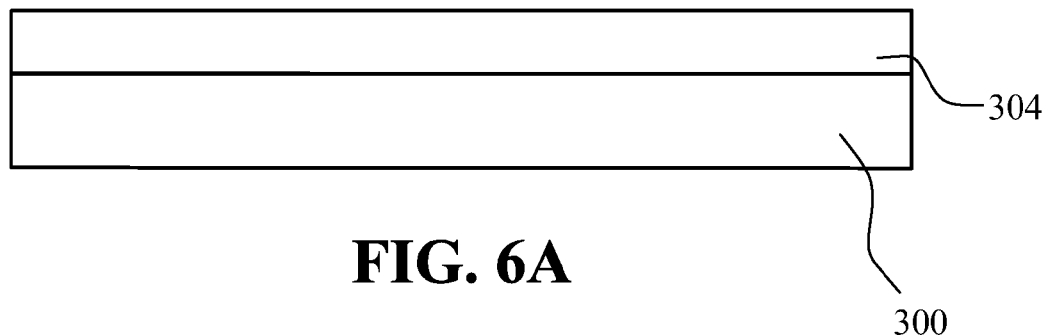
FIG. 6A to FIG. 6F depict a structural flow chart of a manufacturing method of a metal structure in a multi-layer substrate according to the fourth embodiment of the present invention.
Figure 6B:
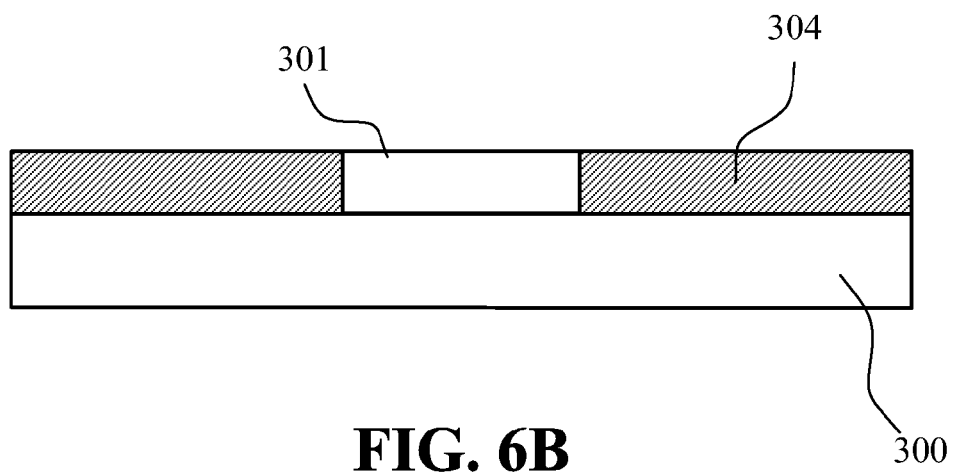
Figure 6C:
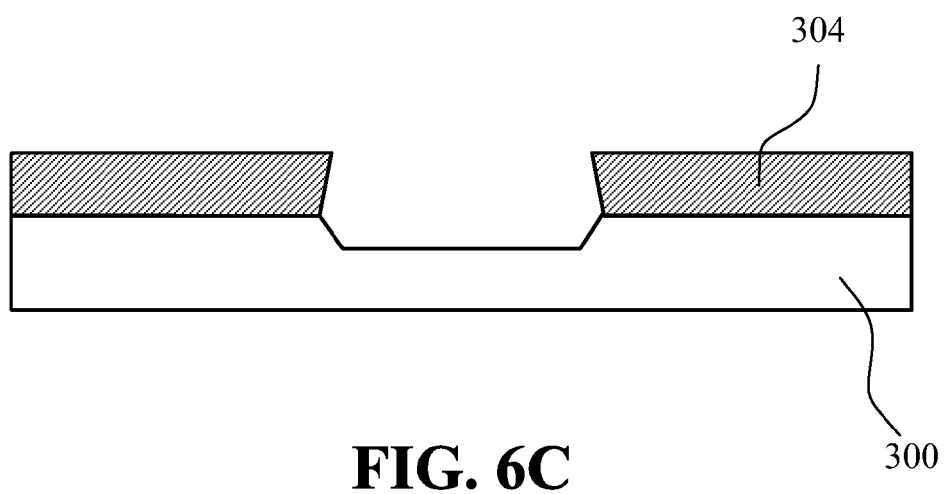
Figure 6D:
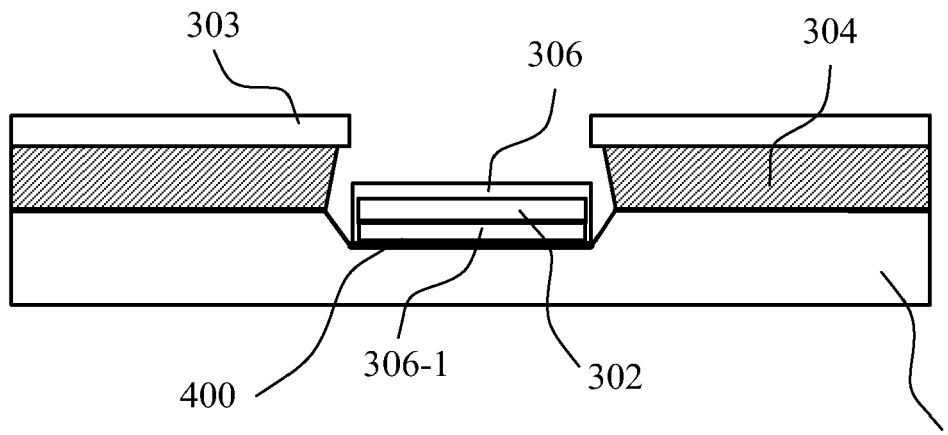
Figure 6E:
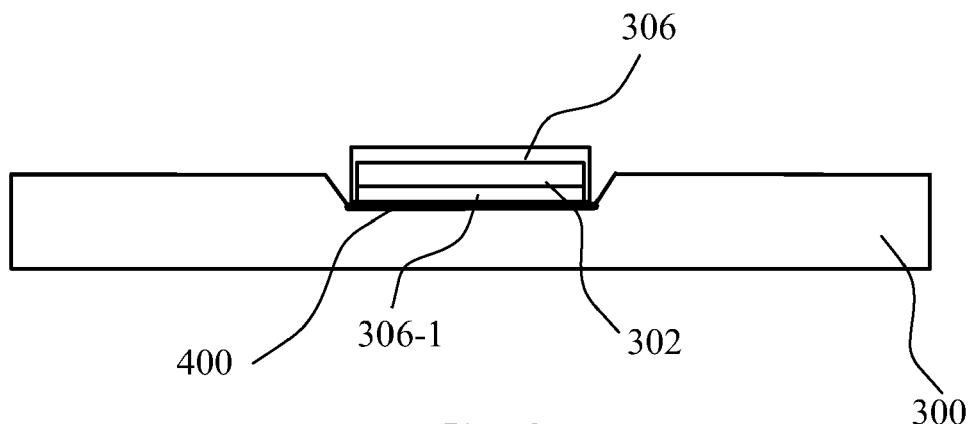
Figure 6F:
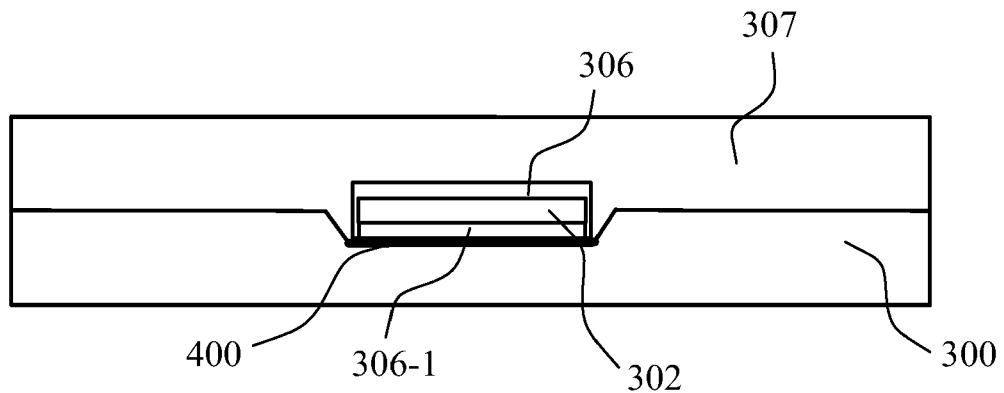

Please refer to FIG. 6A to FIG. 6F, which depict a structural flow chart of a manufacturing method of a metal structure in a multi-layer substrate according to the fourth embodiment of the present invention. The steps shown in FIG. 6A to FIG. 6C are the same as the steps shown in FIG. 4A to FIG. 4C. FIG. 6D shows steps of forming the under-cover metal layer 306-1, and then forming the metal structure 302 at the predetermined position (also forming a metal layer 303 on the photoresist layer 304), moreover, forming a top-cover metal layer 306 on the surface of the metal structure 302 to cover the metal structure 302 completely.

Furthermore, the manufacturing method of the present invention may comprise a step of forming an under-cover dielectric layer on the under-cover metal layer 306-1 after the step of forming under-cover metal layer 306-1 and a step of forming a top-cover dielectric layer on the metal structure 302 before the step of forming the top-cover metal layer 306 on a top surface and two side surfaces of the metal structure 302. Accordingly, the metal structure 302, the top-cover dielectric layer, the under-cover dielectric layer, the top-cover metal layer 306 and the under-cover metal layer 306-1 can be employed as a coaxial structure. The top-cover metal layer 306 and the under-cover metal layer 306-1 can be a metallic shield to transmit the high frequency signals.

Furthermore, the present invention can also replace the top-cover metal layer 306 and the under-cover metal layer 306-1 shown in FIG. 6D with a top-cover dielectric layer and an under-cover dielectric layer formed by a vacuum coating to provide a complete protection to the metal structure 302. As shown in FIG. 6D, before the step of forming the under-cover metal layer 306-1, the manufacturing method of the present invention may comprise a step of implementing an interface adhesion enhancing process (such as a plasma treatment) on the surface 400 of the dielectric layer 300 at the predetermined position to increase adhesion intensity between the dielectric layer 300 and the under-cover metal layer 306-1.

In the fourth embodiment of the present invention, the dielectric layer 300 at the predetermined position becomes a concave structure due to etching the certain depth thereof. Such concave structure attends to strengthen adhesion of the metal structure 302 to the dielectric layer 300 while it is formed thereon. During the step of forming the metal structure 302, the thickness of the metal structure 302 can also be tuned to be as high as the dielectric layer 300 to provide a total flat surface for the processes thereafter. Alternatively, the thickness of the metal structure 302 can also be tuned when forming in the middle between the dielectric layer 300 and the dielectric layer 307. Accordingly, a better stress balance when bending the multi-layer substrate can be obtained, so as to make a multi-layer substrate more flexible and less warped.

In all embodiments of the present invention, the material of the dielectric layer 300 can be polyimide. The material of the metal structure 302 can be copper. The material of top-cover metal layer 306 and the under-cover metal layer 306-1 can be chromium, titanium, gold, platinum or nickel. The interface adhesion enhancing process can be a plasma process.

Specifically, the manufacturing method of the present invention not only can form a top-cover metal layer 306 covering the top surface of the metal structure 302, but also can form the top-cover metal layer 306 covering the two side surfaces of the metal structure 302 at the same time. It prevents the metal structure 302 from corrosion or contamination, so as to raise the reliability of the metal structure. If a top-cover dielectric layer and an under-cover dielectric layer are formed between the metal structure 302 and the top-cover, under-cover metal layers 306, 306-1, accordingly, a coaxial structure can be realized.

In conclusion, in comparison with prior arts, the metal structure of the present invention is not manufactured by an etching method, therefore will not be limited by the size of the metal grain. The surface of the metal structure is fine, smooth straight but no roughness happens thereon. The present invention can form a top cover metal layer 306 covering the top surface and the two side surfaces, even an under-cover metal layer 306-1 covering the under surface of the metal structure by one single photomask. While the size of the metal structure 302 gets smaller continuously with miniaturization of integrated circuits in the multi-layer substrate, the present invention still can satisfy the demand for the finer metal structure 302 and can provide a simpler manufacturing process than prior arts to raise the reliability and yield to the multi-layer substrate.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A metal structure in a multi-layer substrate, comprising:
a metal structure, positioned at a predetermined position on a dielectric layer;
a top-cover metal layer, positioned at a top surface of the metal structure and covered two side surfaces of the metal structure;
an under-cover metal layer, positioned at an under surface of the metal structure;
a top-cover dielectric layer, formed between the metal structure and the top-cover metal layer; and
an under-cover dielectric layer, formed between the metal structure and the under-cover metal layer, wherein the dielectric layer at the predetermined position is a concave structure.

2. The metal structure of claim 1, wherein the material of the dielectric layer is polyimide.

3. The metal structure of claim 1, wherein the material of the metal structure is copper.

4. The metal structure of claim 1, wherein the material of the top-cover metal layer is selected from chromium, titanium, gold, platinum and nickel.

* * * * *